United States Patent
Ma et al.

(10) Patent No.: US 9,294,079 B1
(45) Date of Patent: Mar. 22, 2016

(54) SYSTEM AND METHOD FOR GENERATING MULTI-BAND SIGNAL

(71) Applicant: Mitsubishi Electric Research Laboratories, Inc., Cambridge, MA (US)

(72) Inventors: Rui Ma, Somerville, MA (US); SungWon Chung, Los Angeles, CA (US); Koon Hoo Teo, Lexington, MA (US)

(73) Assignee: Mitsubishi Electric Research Laboratories, Inc., Cambridge, MA (US)

( * ) Notice: Subject to any disclaimer, the term of this patent is extended or adjusted under 35 U.S.C. 154(b) by 0 days.

(21) Appl. No.: 14/536,913

(22) Filed: Nov. 10, 2014

(51) Int. Cl.
*H04L 25/49* (2006.01)
*H03K 7/08* (2006.01)

(52) U.S. Cl.
CPC .............. *H03K 7/08* (2013.01); *H04L 25/4902* (2013.01)

(58) Field of Classification Search
CPC ....... H03K 7/08; H04L 25/4902; H04L 25/02
USPC .................. 375/238, 295; 332/109
See application file for complete search history.

(56) References Cited

U.S. PATENT DOCUMENTS

| | | | |
|---|---|---|---|
| 6,133,788 A | 10/2000 | Dent et al. | |
| 6,321,075 B1 | 11/2001 | Butterfield et al. | |
| 7,262,658 B2 | 8/2007 | Ramaswamy et al. | |
| 7,826,553 B2 | 11/2010 | Chen et al. | |
| 8,169,272 B2 | 5/2012 | Chen et al. | |
| 8,203,386 B2 | 6/2012 | Heijden et al. | |
| 8,659,353 B2 | 2/2014 | Dawson et al. | |
| 2013/0156089 A1* | 6/2013 | Hezar et al. | 375/238 |
| 2013/0177062 A1 | 7/2013 | Hori et al. | |
| 2013/0229227 A1 | 9/2013 | Maniwa et al. | |
| 2013/0241663 A1* | 9/2013 | Ding et al. | 332/109 |
| 2014/0269892 A1* | 9/2014 | Ma et al. | 375/238 |

OTHER PUBLICATIONS

Maehata Takashi et al: "Concurrent dual-band 1-bit digital transmitter using band-pass delta-sigma modulator," 2013 European Microwave Integrated Circuit Conference, European Microwave Association, Oct. 6, 2013, pp. 552-555, XP032533950.

(Continued)

*Primary Examiner* — Betsy Deppe
(74) *Attorney, Agent, or Firm* — Gene Vinokur; Dirk Brinkman

(57) ABSTRACT

A method for generating a multi-band signal transforms multiple base-band envelope signals into a sequence of symbols representing a signal including a plurality of disjoint frequency bands. Each frequency band corresponds to a single base-band envelope signal. Each symbol corresponds to amplitude of the signal and is a number selected from a finite set of numbers. The method encodes the sequence of symbols as a plurality of pulse width modulation (PWM) signals. Each PWM signal includes a plurality of codes for encoding each symbol, such that a sum of values of the codes of the set of PWM signals encoding a symbol is proportional to a value of the symbol. The method amplifies the PWM signals to produce a plurality of amplified signals and combines the amplified signals to produce the multi-band signal.

14 Claims, 14 Drawing Sheets

(56) References Cited

OTHER PUBLICATIONS

Chung Sungwon et al: "Outphasing multi-level RF-PWM signals for inter-band carrier aggregation in digital tansmitters," 2015 IEEE Radio and Wireless Symposium (RWS), I E E E, Jan. 25, 2015 pp. 212-214 XP032787665.

Chung Sungwon et al: "Concurrent Multiband Digital Outphasing Transmitter Architecture Using Multidimensional Power Coding," IEEE Transactions on Microwave Theory and Techniques, IEEE Service Center, Piscataway, NJ, US, vol. 63 No. 2, Feb. 1, 2015, pp. 598-613 XP011572356.

* cited by examiner

| 505 | | 547 | 549 |
|---|---|---|---|
| -4 | ↑ | {{-1,-1,-1}, | {-1,-1,-1}} |
| -3 | ↑ | {{-1,-1, 0}, | {0,-1,-1}} |
| -2 | ↑ | {{ 0,-1, 0}, | {0,-1, 0}} |
| -1 | ↑ | {{ 0,-1, 0}, | {0, 0,-1}} |
| 0  | ↑ | {{ 0, 0, 0}, | {0, 0, 0}} |
| 1  | ↑ | {{ 0, 1, 0}, | {0, 0, 1}} |
| 2  | ↑ | {{ 0, 1, 0}, | {0, 1, 0}} |
| 3  | ↑ | {{ 1, 1, 0}, | {0, 1, 1}} |
| 4  | ↑ | {{ 1, 1, 1}, | {1, 1, 1}} |

SYSTEM AND METHOD FOR GENERATING MULTI-BAND SIGNAL

FIELD OF THE INVENTION

This invention relates generally to signal transmission and specifically to a system and a method for generating multi-band signal suitable for concurrent non-contiguous multi-band operation.

BACKGROUND OF THE INVENTION

A direct digital radio frequency (RF) transmitter (TX) has several advantages compared to the digital-analog-RF transmitters. The direct digital-RF transmitter shifts the digital-analog interface close to the antenna, and thus fewer analog components are involved. Typical analog issues like In-phase (I) and Quadrature-phase (Q) signals mismatch, local oscillator leakage, and image distortion can be largely alleviated and even avoided in direct-digital-RF transmitters. The direct digital-RF transmitter also enhances system flexibility through multi-mode and multi-band operation enabled by digital signal processing. In addition, the direct digital-RF transmitter can take advantage of the increasing speed and capacity of digital processing, as well as high-level integration. Moreover, the power amplification in digital transmitter is based on highly efficient switch-mode operation, improving the transmitter energy efficiency and environment. Thus, the direct digital-RF transmitters have benefits for both wireless base-station and mobile applications.

In order to increase a wireless data rate and to improve network coverage with the efficient use of spectrum, concurrent multi-band transmission methods have been developed. For example, the long-term evolution (LTE) communication standard defines non-contiguous carrier aggregation for concurrently transmitting multiple disjoint frequency bands. Accordingly, there is a need to generate a signal with multiple disjoint frequency bands and sufficient power for radio transmission.

Some methods generate multi-band signal simply by using multiple transmitters, i.e., each transmitter transmits RF signals on one frequency band. The reason for using multi-transmitters is a limited bandwidth that each transmitter can support. Particularly, when the multiple bands are not adjacent, i.e. non-contiguous, the transmitter bandwidth becomes a bottleneck. In conventional RF transmitters, the bandwidth is largely determined by the Q of RF power amplifier impedance matching network. It can be a difficult task to design broadband and efficient analog RF power amplifier. The multiple-transmitters architecture provides high performance by maintaining a high Q and transmitting each narrow band using a different transmitter. Although this multi-transmitter architecture is straightforward to implement, multi-fold increase in size and cost is inevitable.

Therefore, there is a need to provide a digital transmitter enabling concurrent non-contiguous multi-band operation.

SUMMARY OF THE INVENTION

Some embodiments of the invention are based on a realization that multiple base-band envelope signals can be represented as a sequence of symbols. Each symbol can represent a combination of amplitudes of the envelope signals at an instant of time. Such a combination is independent of the RF frequency and can provide a single representation of disjoint frequency bands.

However, to adequately represent the combination of multiple base-band envelope signals, the values of the symbols in the sequence of symbols should be selected from a relatively large range. The encoding and amplification of such a range of values requires complex multi-level pulse width modulation (PWM) encoders and complex power amplifiers (PA). Accordingly, some embodiments of the invention are based on another realization that the complexity of the PWM encoders and PA can be reduced with help of multiple PWM encoders and PAs encoding and amplifying each symbol of the sequence cooperatively. Thus, the combination of the transformation of the multiple base-band envelope signals into the sequence of symbols with subsequent encoding and amplifying each symbol with multiple encoders and amplifiers allows generating a multi-band signal in digital domain.

Some embodiments of the invention are based on another realization that encoding of the baseband envelope signals with subsequent radio frequency (RF) upsampling is ill-suited to support concurrent multiband transmission because of spurious tones merged with intended transmitting signals. However, the RF transformation with subsequent encoding avoids the merging of the spurious tones problem. Accordingly, in one embodiment of the invention, the multi-band signal is a RF communication signal, and the transforming produces the sequence of symbols representing the RF signal that subsequently encoded with multiple PWM signals.

Encoding such a sequence of symbols allows avoiding an upsampling subsequent to the encoding that can create spurious tones in the resulted transmit signals. However, encoding and amplifying multi-band RF signals needs an increased resolution and complex multi-level PWM encoder and PA. Combination of multiple PWM encoders and PAs addresses this problem of complexity.

Accordingly, one embodiment of the invention discloses a method for generating a multi-band signal. The method includes transforming multiple base-band envelope signals into a sequence of symbols representing a signal including a plurality of disjoint frequency bands, wherein each frequency band corresponds to a single base-band envelope signal, and wherein each symbol corresponds to an amplitude of the signal and is a number selected from a finite set of numbers; encoding the sequence of symbols as a plurality of pulse width modulation (PWM) signals, wherein each PWM signal includes a plurality of codes for encoding each symbol, wherein a sum of values of the codes of the set of PWM signals encoding a symbol is proportional to a value of the symbol; amplifying the PWM signals to produce a plurality of amplified signals; and combining the plurality of amplified signals to produce the multi-band signal.

Another embodiment discloses a system for generating a multi-band signal. The system includes a delta-sigma modulator (DSM) for transforming multiple base-band envelope signals into a sequence of symbols representing a signal including a plurality of disjoint frequency bands, wherein each frequency band corresponds to a single base-band envelope signal, and wherein each symbol corresponds to an amplitude of the signal and has a value selected from a finite set of numbers; at least one pulse width modulation (PWM) encoder for encoding the sequence of symbols as a plurality of PWM signals, wherein each PWM signal includes a set of codes for encoding each symbol, wherein a sum of values of the codes of portions of the plurality of PWM signals encoding a symbol is proportional to the value of the symbol; a plurality of switch mode power amplifiers for amplifying the PWM signals by switching states of switching devices according to amplitudes of the PWM signals to produce a plurality of amplified signals; and a combiner for combining the plurality of amplified signals to produce the multi-band signal.

BRIEF DESCRIPTION OF THE FIGURES

FIG. 5B is a table showing examples of code values and encoding different values of the symbols according to one embodiment of the invention;

DETAILED DESCRIPTION OF THE PREFERRED EMBODIMENTS

Figure 1:
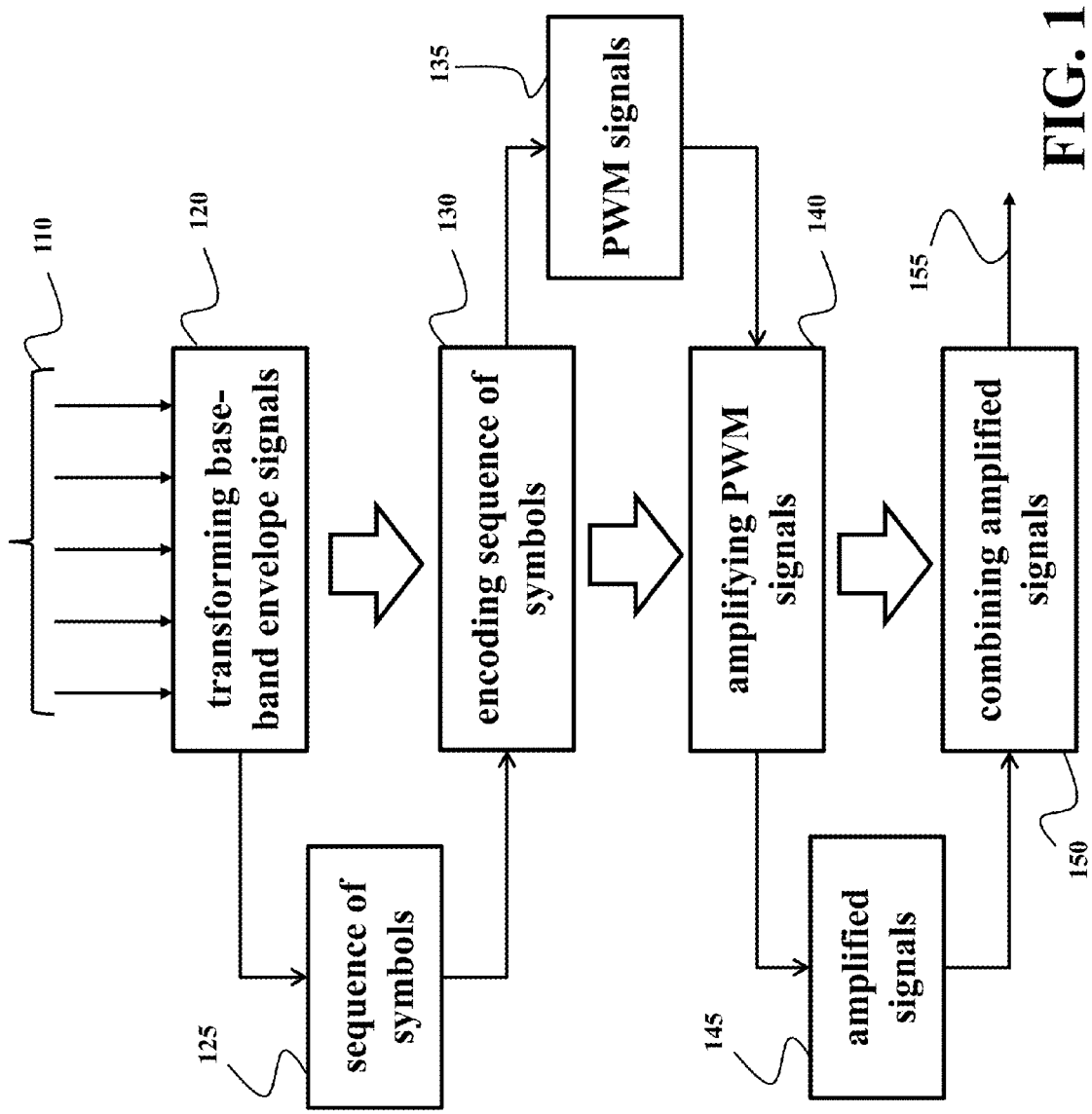
FIG. 1 is a block diagram of a method for generating a multi-band signal according to one embodiment of the invention.

FIG. 1 shows a block diagram of a method for generating a multi-band signal according to one embodiment of the invention. The embodiment transforms 120 multiple base-band envelope signals 110 into a sequence of symbols 125. The base-band envelope signals 110 can be generated from a data signal using, e.g., an amplitude-phase splitter, or generated directly from the data to be transmitted.

In some variations, base-band envelope signals correspond to disjoint frequency bands, wherein each frequency band corresponds to a single base-band envelope signal. Thus, the sequence of symbols represents a signal including a plurality of disjoint frequency bands, wherein each symbol corresponds to amplitude of the signal that is selected from a finite set of numbers.

The embodiment encodes 130 the sequence of symbols 125 as a plurality of pulse width modulation (PWM) signals 135. Each PWM signal includes a set of codes for encoding each symbol. To that end, the sampling rate of PWM signal is greater that the sampling rate of the sequence of symbol. For example, in one implementation, each symbol is represented with four values of the code of each PWM signal, i.e., the sampling rate of the encoding is four times greater than the sampling rate of generation of the sequence of symbols.

Each symbol is encoded such that a sum of values of the codes of the set of PWM signals encoding a symbol is proportional to a value of the symbol. In some variations, a coefficient of proportionality defining the ratio of the value of each symbol to the sum of values of the codes is not one, which allows reducing the complexity of PWM encoding.

The embodiment amplifies 140 the PWM signals to produce a set of amplified signals 145 and combines 150 the set of amplified signals to produce the multi-band signal 155. In some variations, the PWM signals are amplified concurrently using multiple amplifiers.

Figure 2:
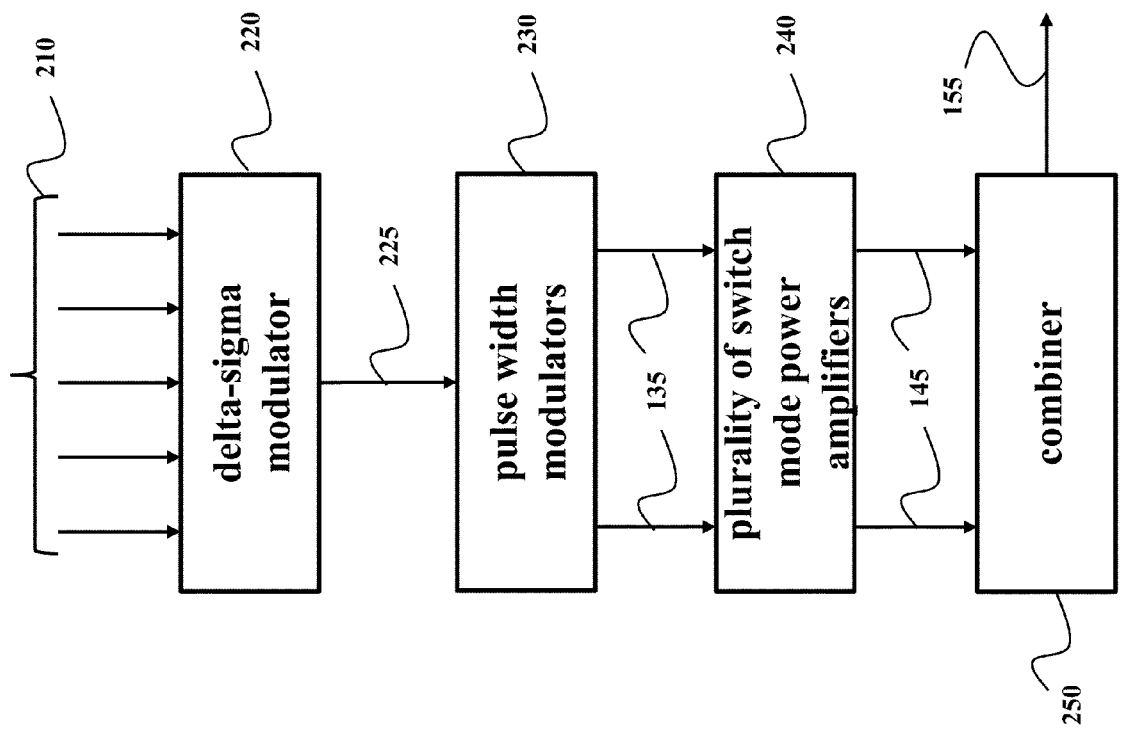
FIG. 2 is a block diagram of a system implementing steps of the method of FIG. 1 according to one embodiment of the invention.

FIG. 2 shows a block diagram of a system implementing steps of the method of FIG. 1 according to one embodiment of the invention. This embodiment uses a single-bit delta-sigma modulator (DSM) 220 for producing the sequence of symbols 125 representing a signal including a plurality of disjoint frequency bands. The DSM 220 can receive multiple base-band envelope signals 110 through multiple multi-bit buses 210 and output a single bit 225, i.e., the value of the symbol in the sequence of symbols 125.

Next, one or plurality of PWM 230 encodes the bit 225 with codes of PWM signals. A plurality of switch mode power amplifiers 240 amplify the PWM signals by switching states of switching devices according to amplitudes of the PWM signals to produce a set of amplified signals 145. A combiner 250, e.g., Chireix power combiner, combines the set of amplified signals to produce the multi-band signal 155.

Figure 3:
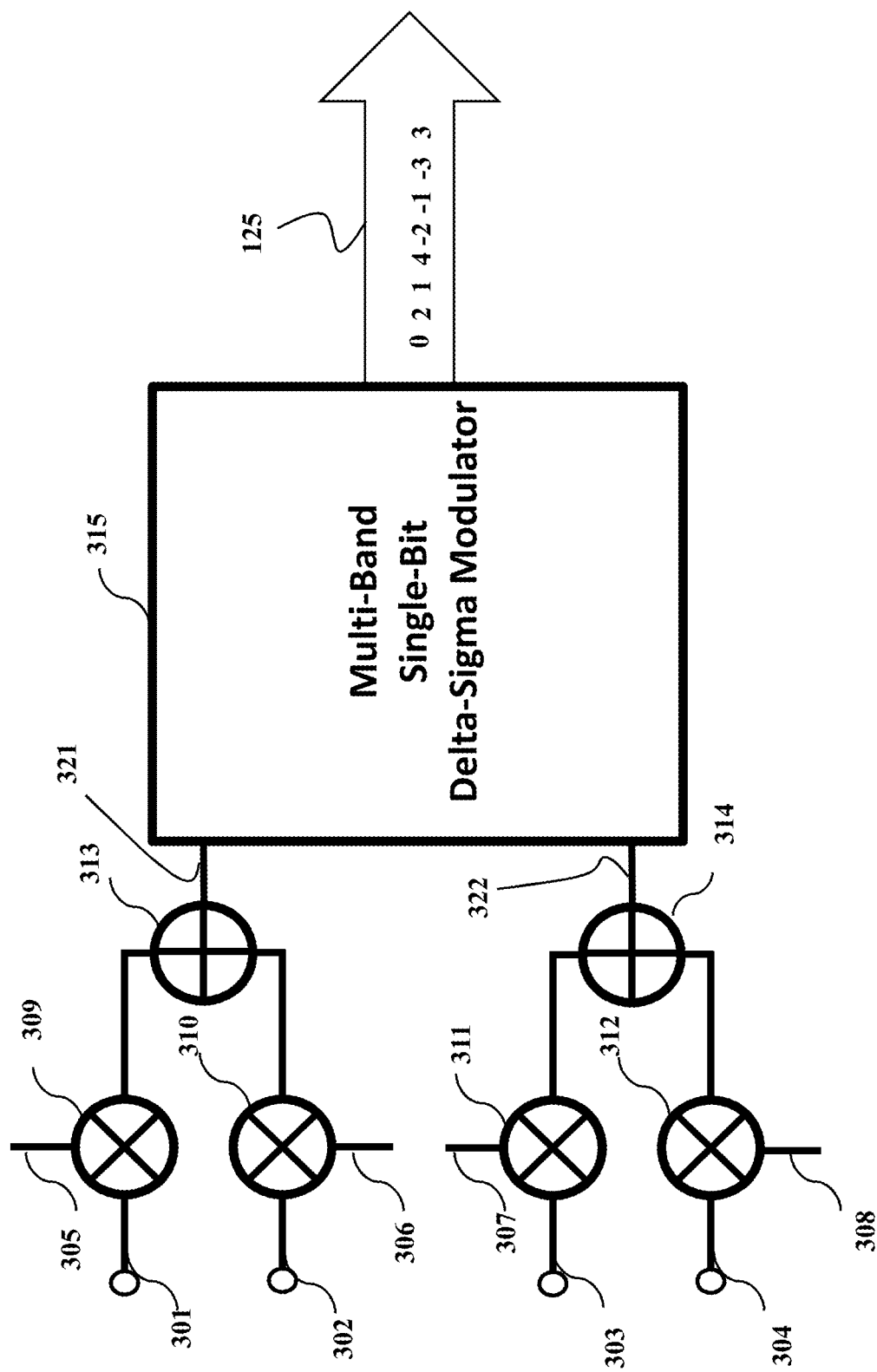
FIG. 3 is a block diagram of an exemplar implementation of delta-sigma modulator (DSM) according to one embodiment of the invention.

FIG. 3 shows a block diagram of an exemplar implementation of the DSM 220 according to one embodiment of the invention. In this embodiment the DSM 220 includes single-bit multi-band band-pass delta-sigma modulator (BPDSM) 315. The BPDSM 315 has a single bit output bus and multiple multi-bit input buses. For example, for a dual-band implementation, the BPDSM 315 receives a band signal 321 and a band signal 322 as two digital inputs. In some embodiments, the signals 321 and 322 are RF signals.

The BPDSM 315 combines, e.g., sums, the digitally represented RF signals 321 and 322, and then converts these multi-bit digital signals into a single bit digital output. The band signal 321 can be determined by quadrature modulation using the two digital mixers 309 and 310 for mixing signals 301 and 305 and signals 302 and 306 and the combiner 313. The band signal 322 can be similarly determined by using the digital mixers 311 and 312 and the combiner 314 for mixing the signals 303, 307, 304 and 308. Advantageously, this embodiment supports all-digital implementation of the DSM 220.

Figure 4:
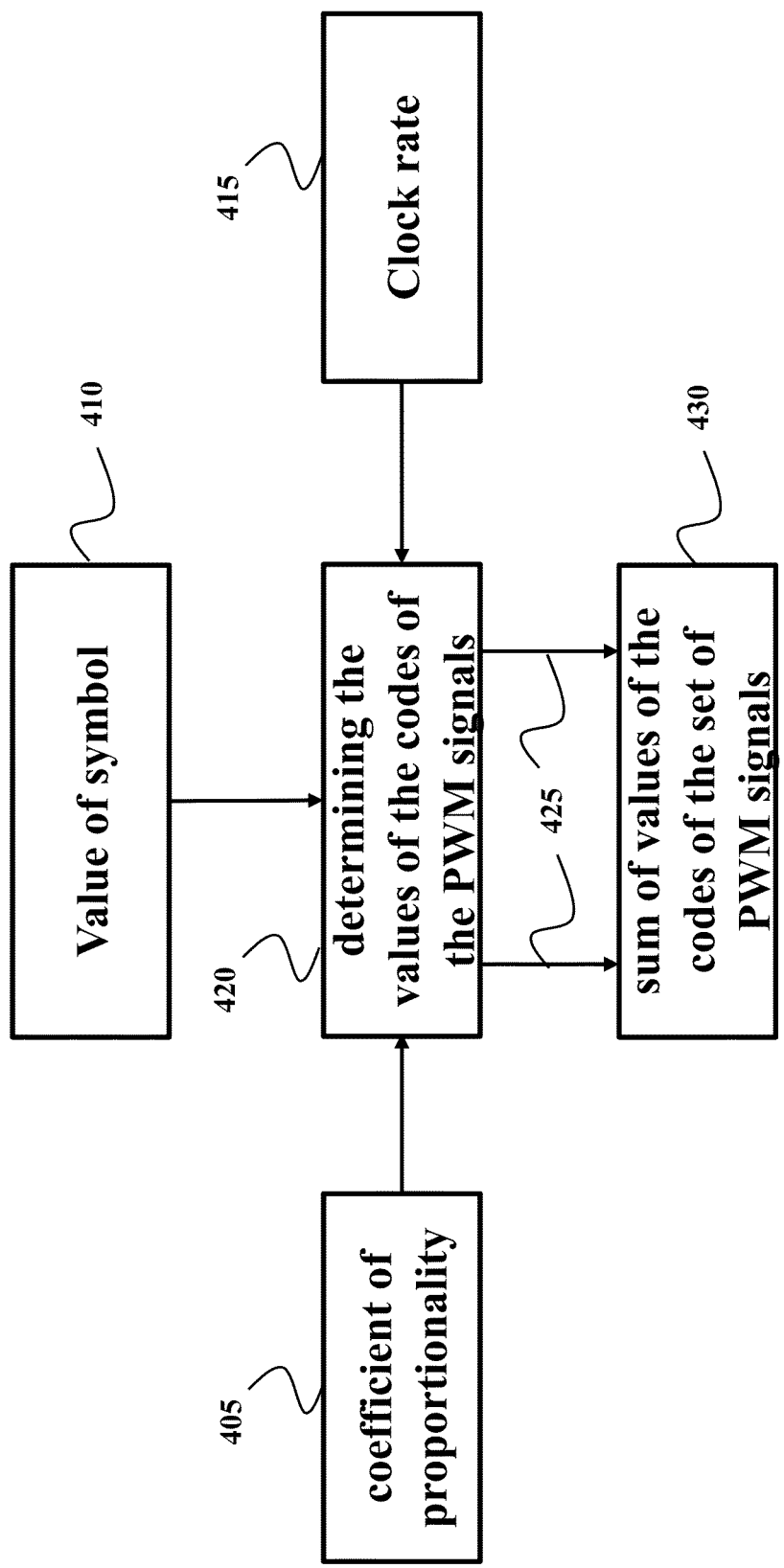
FIG. 4 is a schematic of encoding a value of symbol as codes of portions of multiple PWM signals according to one embodiment of the invention.

FIG. 4 shows a schematic of encoding the value 410 of the symbol 225 as codes of portions of multiple PWM signals. Each portion 425 of each PWM signal encoding the symbol includes multiple codes 420 with the number defined by a clock rate 415 of the PWM encoder. The values 410 of the symbol is encoded such that the sum 430 of values of the codes of the set of PWM signals encoding a symbol is proportional to a value of the symbol with a coefficient of proportionality 405 defining the ratio of the value of each symbol to the sum of values of the codes.

In some embodiments, the coefficient of proportionality 405 is selected to balance the accuracy of the encoding with its complexity. For example, in one embodiment, the coefficient proportionality equals a size of the set of the PWM signals. For example, if the symbols are encoded with two-level PWM signals, the coefficient of proportionality equals two. In some embodiments, the coefficient of proportionality is selected based on the desired number of levels of the PWM encoders. For example, one embodiment determines a maximal or a minimal value of the number in the finite set and determines a level of the PWM signal based on the maximal or the minimal value, the coefficient of proportionality, and a size of the set of the PWM signals.

The numbers of PWM levels are related with the switching stage digital PA architecture, whose possible discrete level statues represent the PWM levels. The more PWM level introduced, generally the more complex the digital PA structure is, with increased performance of coding efficiency. However, in practice, the three or five PWM levels can be a reasonable tradeoff between the performance and complexity.

Figure 5A:
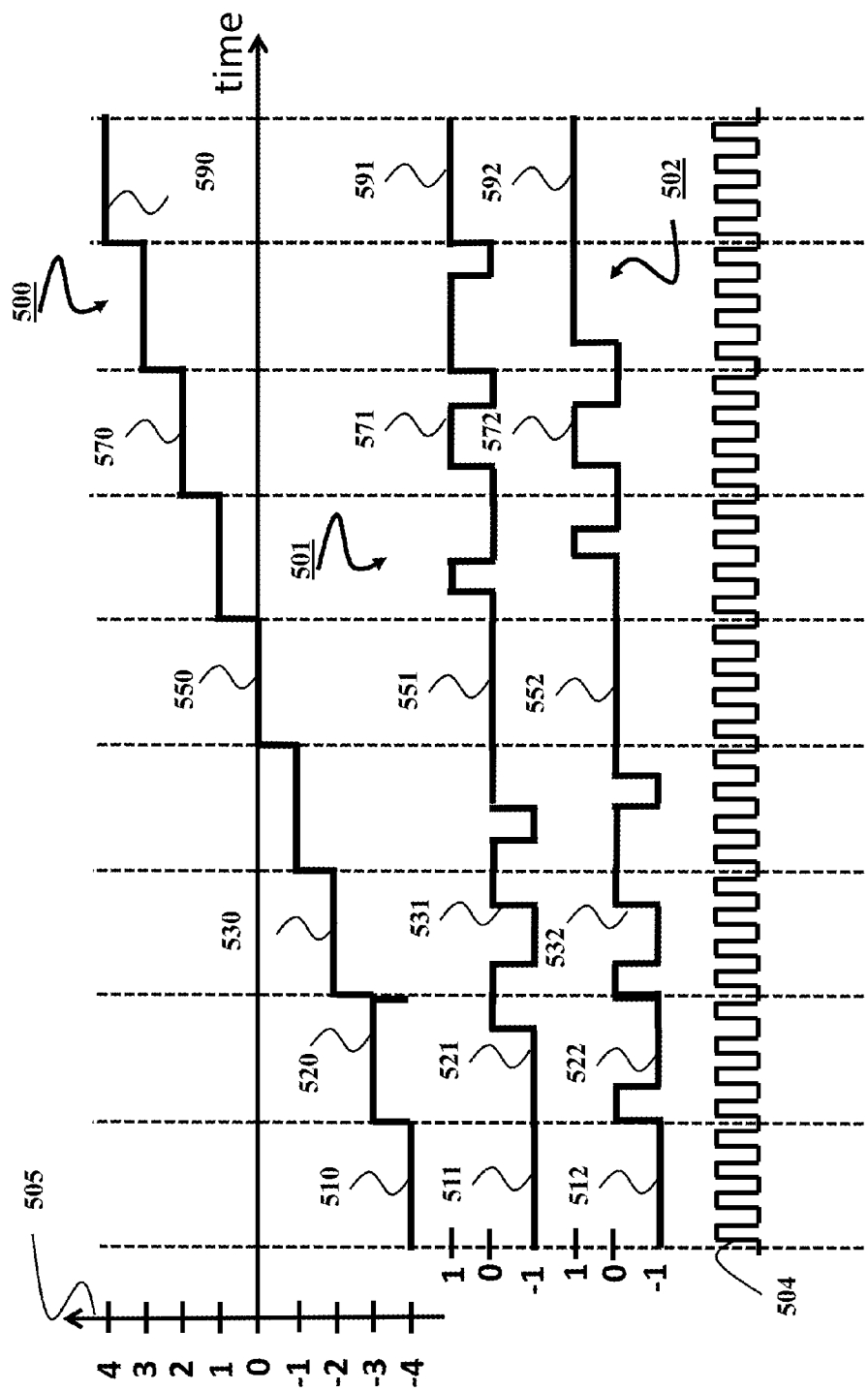
FIG. 5A is an example of encoding the symbols with two PWM encoders according to one embodiment of the invention.

FIG. 5A shows an example of encoding the symbols with two PWM encoders. In this example, the values 500 of the symbols are selected from nine possible values of the numbers in a finite set [−4, 4] 505. The level of each PWM encoder is three, i.e., each code of the PWM signal has a value of −1, 0, or 1. The coefficient of proportionality is two, i.e., the sum of portions of the two PWM signals 501 and 502 encoding the symbol is twice as much as the value of the symbol. The clock rate 504 of the encoding is four times greater than the clock rate for producing the sequence of symbols, i.e., each PWM signal encodes each symbol with four values of the code.

For example, the value of the symbol 510 equals "−4" and is the minimal possible value represented with codes 511 and 512 having "−1" values. Similarly, the value of the symbol 590 equals "4" and is the maximal possible value represented with codes 591 and 592 having "1" values. The value of the symbol 550 equals "0" and represented with codes 551 and 552 having "0" values. All other values of the symbols are formed with combinations of the codes of different values.

For example, the value of the symbol 520 equals "−3" is encoded with codes 521 and 522 each having one "0" value and three "−1" values. The value of the symbol 570 equals "2" is encoded with codes 571 and 572 each having two "0" values and two "1" values.

FIG. 5B shows a table 535 showing examples of code values 547 and 549 encoding the symbols. In various embodiments of the invention, the values of the codes of the PWM signals are determined such that each value of the code encoding the symbol does not have a sign opposite to a sign of the sum of the values of the codes encoding the symbol. For example, when the symbol has a negative value, the symbol is encoded with negative or zero values for all codes encoding the symbol. The symbol having a positive value is encoded with positive or zero values for all codes encoding the symbol, and the symbol having a zero value is encoded with zero values for all codes encoding the symbol. Such encoding is advantageous over an out-phasing technique based on vector addition, which is sensitive to mismatch between the two signals, especially for low amplitude symbol, with a huge amount of power dissipation happening in the power combination circuit. In contrast with the out-phasing technique, the encoding values according to various embodiments of the invention do not cancel each other, which can improve efficiency of the subsequent amplifying and combining steps.

In some embodiments of the invention, the values of the codes of the PWM signals are selected to be mutually symmetric such that the sum of corresponding values of the codes of the portions of the PWM signals is symmetric around a center of the portions. For example, one embodiment determines a first portion of the first PWM signal encoding the symbol and determines a second portion of the second PWM signal encoding the symbol, such that the second portion is rotationally symmetric to the first portion. For example, the first 521 and the second 522 portions of the PWM signals encoding the value "−3" have asymmetric shape around their centers, but the sum of the values of those portions is symmetric, i.e., $-3 \rightarrow \{-1,-1,-1,0\}+\{0,-1,-1,-1\}=\{-1,-2,-2,-1\}$). Such a symmetric shape of the sum of the portions of the PWM signals minimizes the energy of the PWM signals close to the Nyquist frequency and reduces nonlinear spurs in the transmit spectrum.

Some embodiments of the invention use a lookup table, e.g., the precomputed table 535, to determine values of the codes encoding a symbol. For example, one embodiment selects the first portion from a lookup table stored in a memory using the value of the symbol and rotates the first portion around a center of the portion to produce the second portion. Alternative embodiment selects, using the value of the symbol, the first portion and the second portion from a lookup table stored in a memory.

In some embodiments of the invention, the multi-band signal is a communication signal of radio frequency (RF). In those embodiments, the sequence of symbols represents the RF signal. Encoding such a sequence of symbols allows avoiding an upsampling subsequent to the encoding that can create spurious tones in the resulted transmit signals.

However, the RF transformation with subsequent encoding avoids merging of the spurious tones in the resulted multi-band signal. Accordingly, in one embodiment of the invention the multi-band signal is a communication signal of radio frequency (RF), and the transforming produces the sequence of symbols representing the RF signal that subsequently encoded with multiple PWM signals. Encoding and amplifying multi-band RF signals needs an increased resolution and complex multi-level PWM encoder and PA. Combination of multiple PWM encoders and PAs addresses this problem of complexity.

Figure 6:
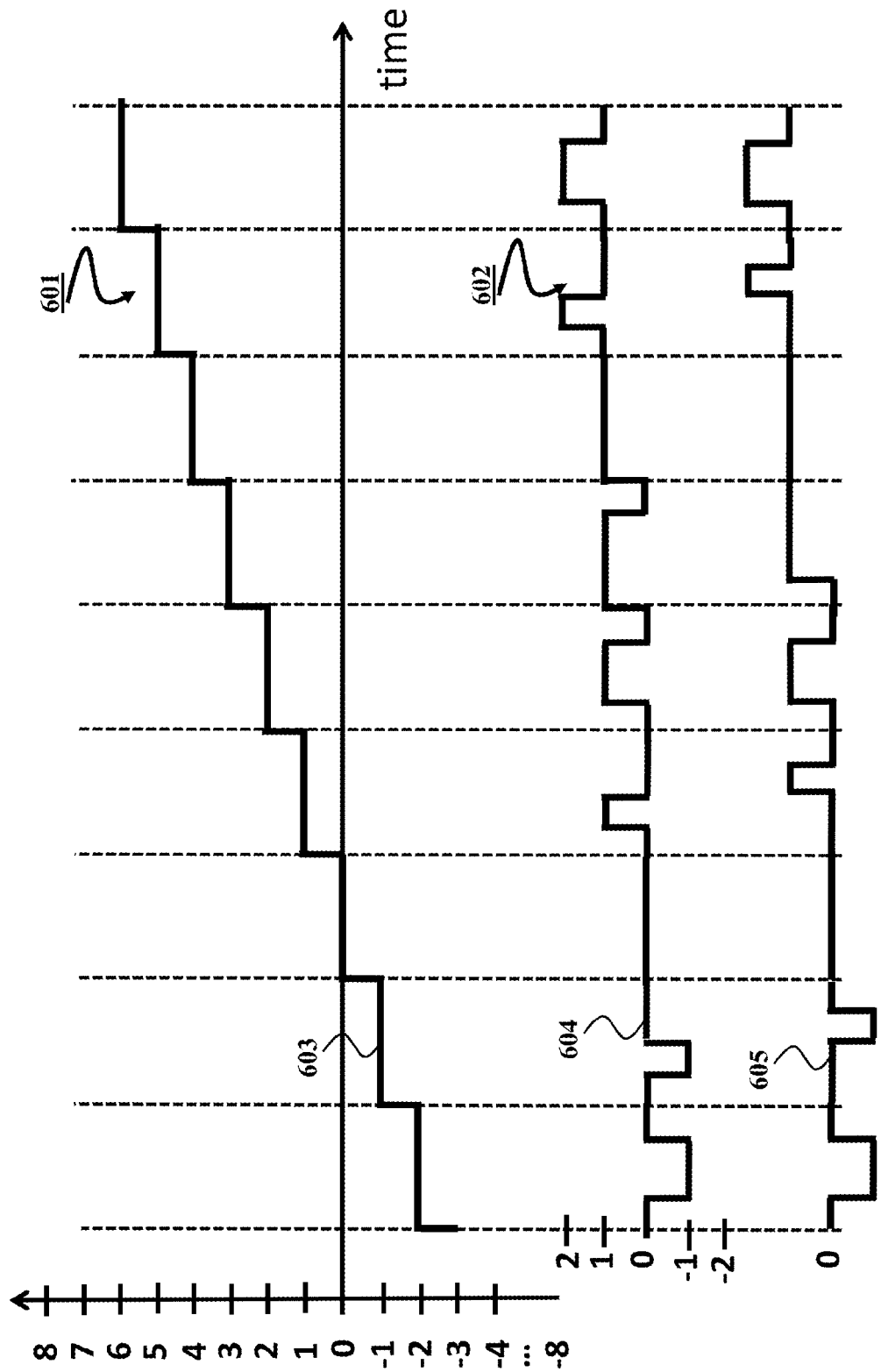
FIG. 6 is an example of encoding the symbols with multi-level RF (MLRF) PWM encoders according to one embodiment of the invention.

FIG. 6 shows that the multi-level RF(MLRF) PWM encoder used for n-level RFPWM. When the sampling clock rate of the MLRF-PWM power encoder 602 is k times faster than the sampling clock rate of the multi-band multi-bit BPDSM 601, m-level PWM allows the BPDSM output sample 603 with n=2m*k+1 steps to be encoded into two MLRF-PWM signals 604 and 605.

Figure 7:
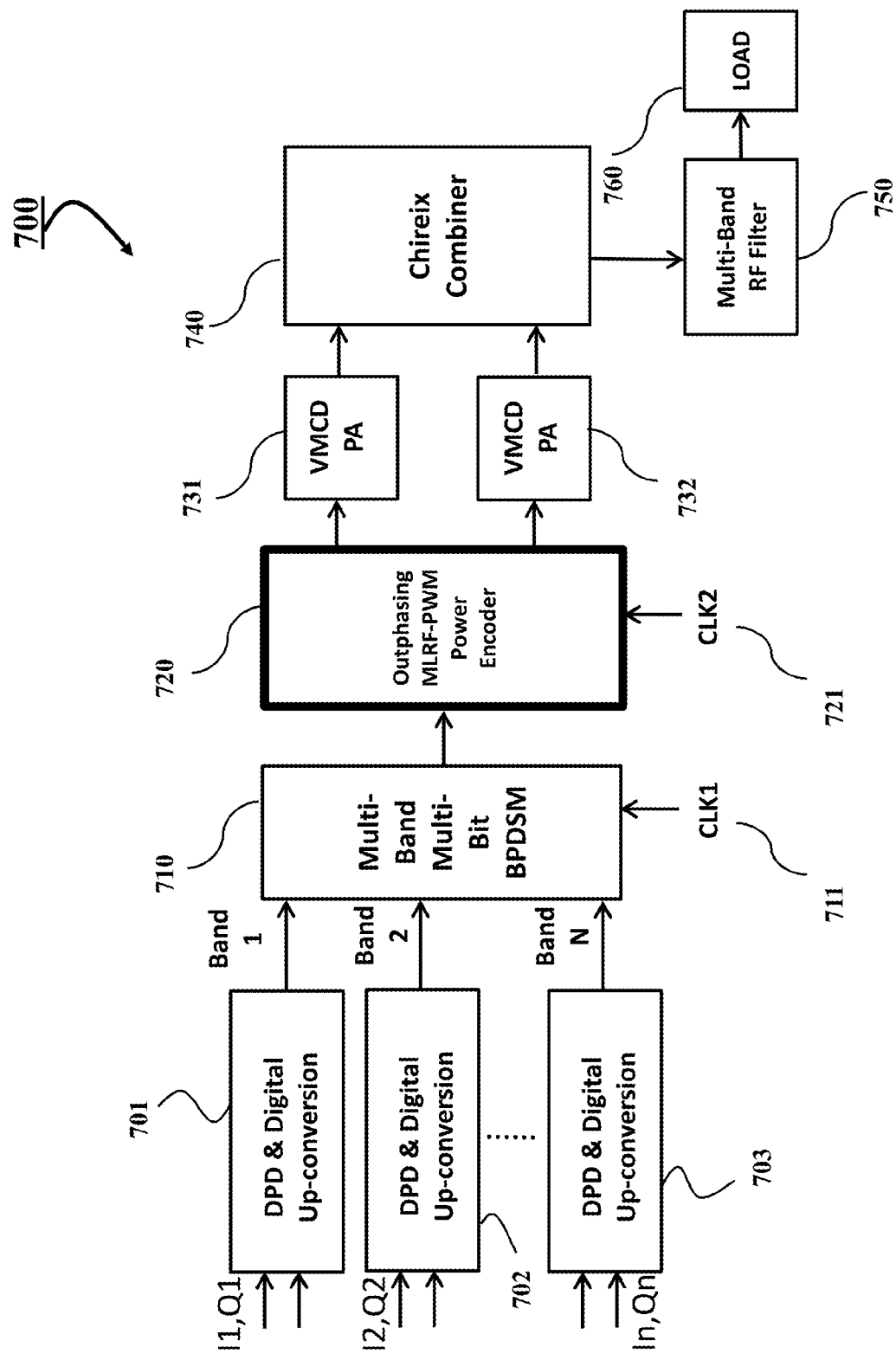
FIG. 7 is a block diagram of a concurrent non-contiguous multi-band transmitter according to one embodiment of the invention.

FIG. 7 shows the block diagram of a concurrent non-contiguous multi-band transmitter according to one embodiment of the invention. Quadrature baseband signals for each band are up-converted to RF and optionally pre-distorted by the block 701, 702, and 703. In some embodiments, the pre-distortion linearizes the overall transmitter considering the whole line-up nonlinearities including those from the PWM encoders, driver amplifier and PAs.

The multi-band multi-bit BPDSM 710 is operated by a sampling clock CLK1 711 that is k times slower than the sampling clock CLK2 721 operating the RFPWM encoder 720. The two PAs 731 and 732, e.g. voltage mode class-D amplifiers combine their output power using a Chireix combiner 740 whose output is filtered by a dual-band RF filter 750 in analog format and transmitted to the load 760 radiated by antenna. The advantage of using RFPWM over the envelope-PWM encoders is that the same all-digital transmitter can be used for any number of concurrently transmitted bands.

Some embodiments of the invention, such as the embodiment of FIG. 7, reduce cost and complexity in the implementation of concurrent multi-band RF transmitters for very high data rate wireless applications. Such all-digital transmitter architecture is well suited to the leading-edge digital integrated circuits (IC). Because analog back-ends driving an RF PA are not required, accurate calibration circuits can be avoided. Also, sophisticated semiconductor foundry options on special RF/analog options are not necessary. The cost advantage of the transmitter according to this embodiment continues to improve, as the digital IC technology scales down. In addition, the new transmitter architecture of this embodiment is smaller than previous designs because a single transmitter without analog back-ends can transmit multi-bands in the same time.

Some embodiments of the invention are based on recognition that a transformation function of PWM is nonlinear, but the input signal, e.g., an envelope signal, has to be mapped linearly by the power encoder. Furthermore, the nonlinearity of the mapping depends on the transformation function and cannot always be determined analytically. For example, the nonlinearity of the mapping can be determined experimentally by applying the transformation function to the input data and building a mapping, e.g., LUT, between the data inputted to the power encoder and the data outputted by the power encoding. Some embodiments, pre-distort 701, 702, and 703 the input data based on the predetermined nonlinearity mapping, such that the transformation function of DSM and PWM transforms the pre-distorted data to the value linear to the input data. To that end, the LUT stores a non-linear mapping of a transformation function used by the transformation and the encoding.

Figure 8:
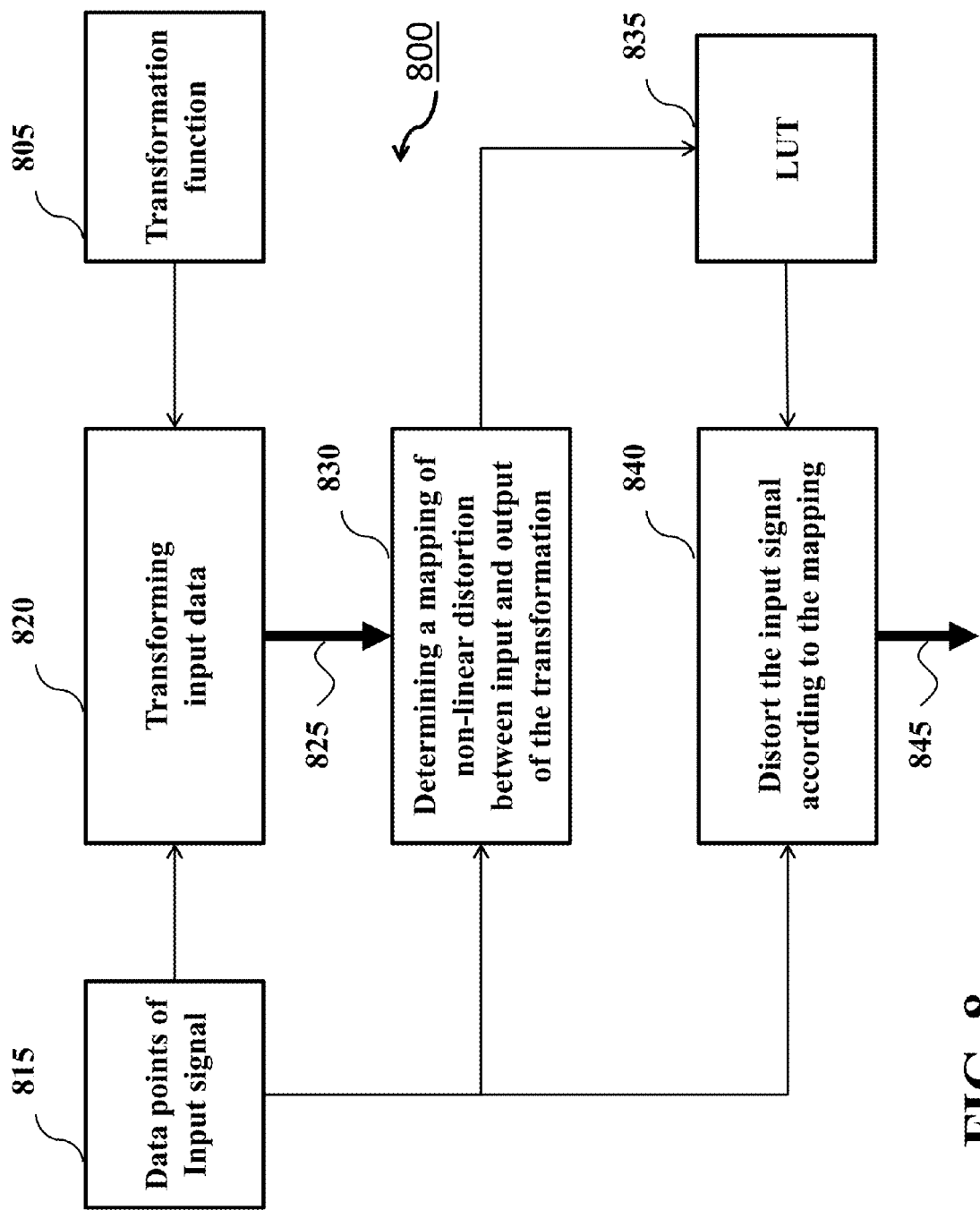
FIG. 8 is a block diagram of a pre-emphasis linearization method according to some embodiments of the invention.

FIG. 8 shows a block diagram of a pre-emphasis linearization method according to some embodiments. The method can be performed by a processor 800. The mapping, e.g., the LUT 835, is determined 830 using a forward mapping by applying the transformation function to a set of input data points. For example, the processor applies 820 the transformation function 805 to the set of data points 815 of the input to produce output data 825. The transformation function can be the amplitude-to-amplitude (AM-AM) transformation function. The LUT 835 is determined 830 as a mapping between the input 820 and the output 825 of the transformation.

In contrast, the distorted data are determined by a backward mapping of the data point of the envelope signal by selecting 840 using the LUT 835 an input to the transformation function corresponding to an output of the transformation function that is equal to the data point of the envelope signal.

For example, the input data received for processing by the power encoder are distorted 840 using the LUT 835 to produce the distorted data. The distorted data 845 are subsequently encoded by the power encoder to produce encoded data that are linear with the input data. The backward mapping is performed for a set of data points of the input signal, such that each data point of the distorted input signal 845 equals to an input to the transformation function corresponding to an output of the transformation function that is equal to the data point of the input signal.

Figure 9A:
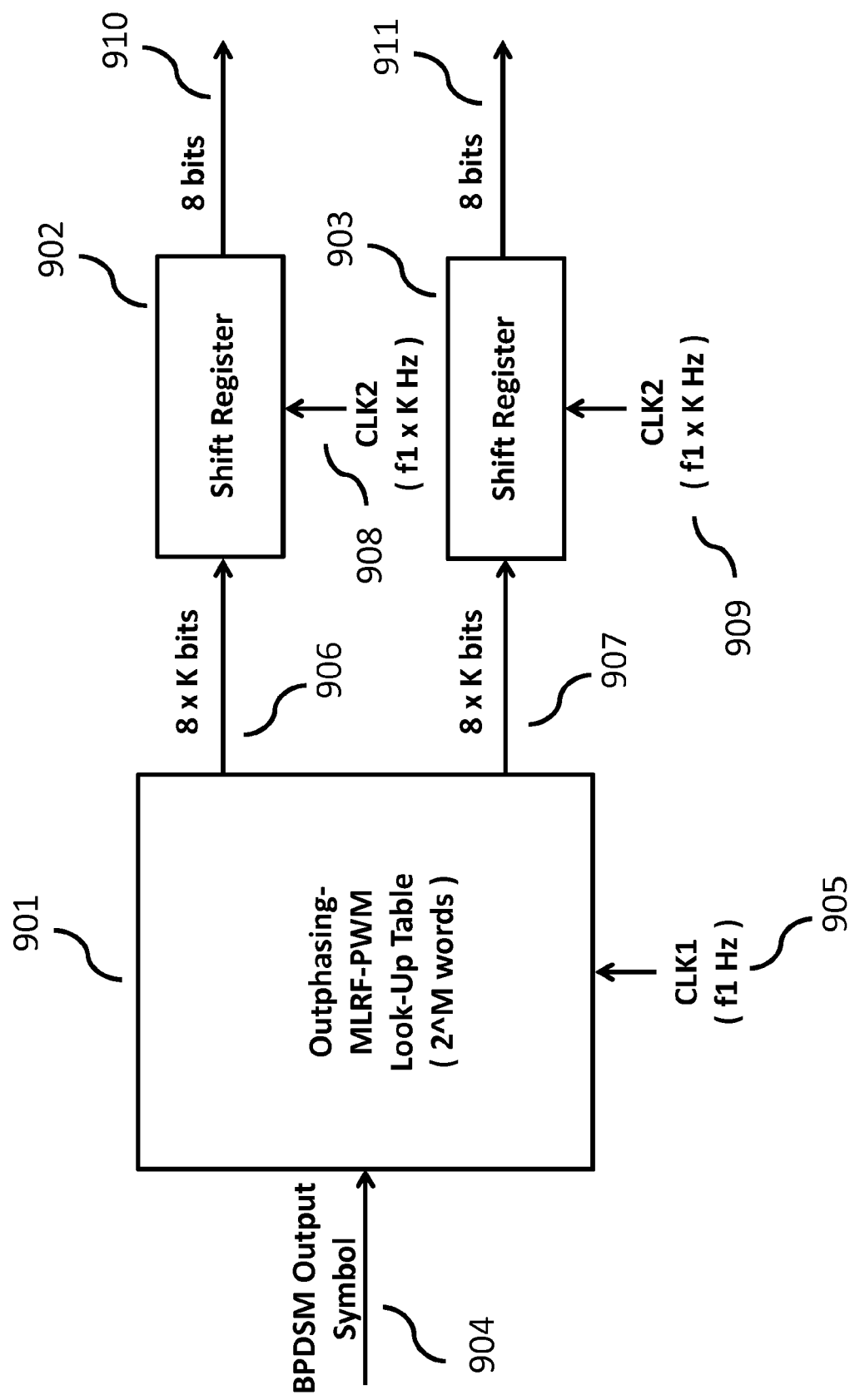
FIG. 9A is a diagram of a look-up table implementation of the PWM power encoder according to one embodiment of the invention.

FIG. 9A shows a look-up table implementation of the PWM power encoder (PWM PE) according to one embodiment of the invention. The PWM PE includes a look-up table (LUT) 901 and two shift registers 902 and 903. The LUT 901 transforms a BPDSM output symbol 904 into a pair of multi-level PWM (MLPWM) codes 906 and 907.

In example of the embodiment, one BPDSM symbol is translated into a pair of 5-level MLPWM codes each with a length of k, e.g., k=4. In this example, a BPDSM output symbol with a value of +1 can be transformed into a pair of MLPWM codes {0,1,0,0} and {0,0,1,0}. In this example, the PWM PE drives two 5-level digital PAs, therefore each MLPWM code is again transformed into 8-bit control signal, which interfaces with a 5-level digital PA. The LUT 901 transforms a given BPDSM output symbol directly into a pair of 8-bit control signals without going through a pair of 5-level MLPWM codes with a length of k. Therefore, for a given BPDSM output symbol 904, the LUT output 906 and 907 have 8×k bits.

A single BPDSM output symbol corresponds to a pair of MLPWM codes with a length of k, the shift register output rate should be k times faster than the BPDSM output rate. Therefore, the 8-bit shift register output rate, which is determined by CLK2 909, is faster than the LUT output rate by k times. For each clock cycle of CLK1, 8×k bits enter the shift register, while the shift register produces 8 bits for each clock cycle of CLK2.

Figure 9B:
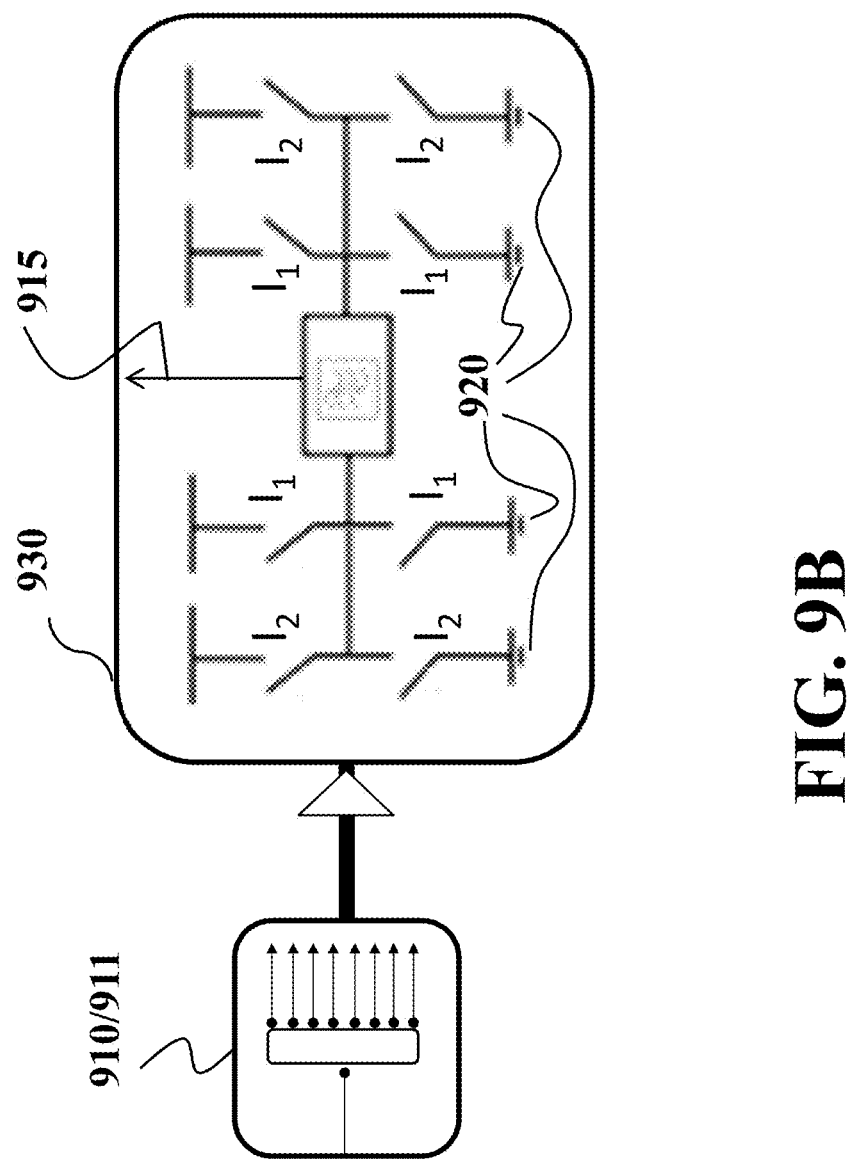
FIG. 9B is a block diagram of a power amplifier according to one embodiment of the invention.

FIG. 9B shows a block diagram of the PA 930 for producing the amplified RF output signal 915 by switching states of switching devices, e.g., the switching devices 920, according to outputs 910 or 911. In some embodiments, a number of switching devices 920 depends on the level of the PWM encoder. For example, in one embodiment the PWM signal has (2n+1) levels, n is a positive natural number, wherein the set of thresholds includes n non-zero values of voltage thresholds, and the PA includes 2n switching devices with non-uniform total current capability for the n non-zero levels of the PWM signal. For example, the PA 930 includes eight ON/OFF switches. To fit the multi-bits input, PA 930 can be configured in H-bridge for 3-level signal, or the paralleled H-bridge for five or more-level signal.

In some embodiments, a distribution of values of a current generated by different switching devices is non-uniform. For example, in some embodiments, the switching devices 820 are transistors having different dimensions to produce different currents. For example, the transistors can be gallium nitride (GaN) transistors with different width of the gates.

In one embodiment, the power amplifier includes 2n switching devices for the n non-zero levels of the PWM signal to produce $I_n$ current for each level, wherein a ratio $a_v = V_{n-1}/V_n$ and a ratio $a_i = I_{n-1}/(I_{n-1} + I_n)$ are between 0.2 and 0.4 inclusively. For example, the power amplifier includes a first switching device for generating a current with a first value $I_1$, such that the power amplifier produces $I_1$ current for the first level of the PWM signal and includes a second switching device for generating a current with a second value $I_2$, such that the power amplifier produces $I_1 + I_2$ current for the second level of the PWM signal, wherein a ratio $a_i = I_1/(I_1 + I_2)$ is between 0.2 and 0.4 inclusively.

Some embodiments of the invention are based on a realization that preceding the PWM encoding with delta-sigma modulation can result in high out-of-band emission. Accordingly, there is a need for noise-cancellation techniques for multi-band delta-sigma modulation. Some embodiments use the noise cancellation technique for dual-band delta-sigma modulation, which relaxes the multi-band RF output filter design as well as reduce the undesirable out-of-band emission.

Figure 10:
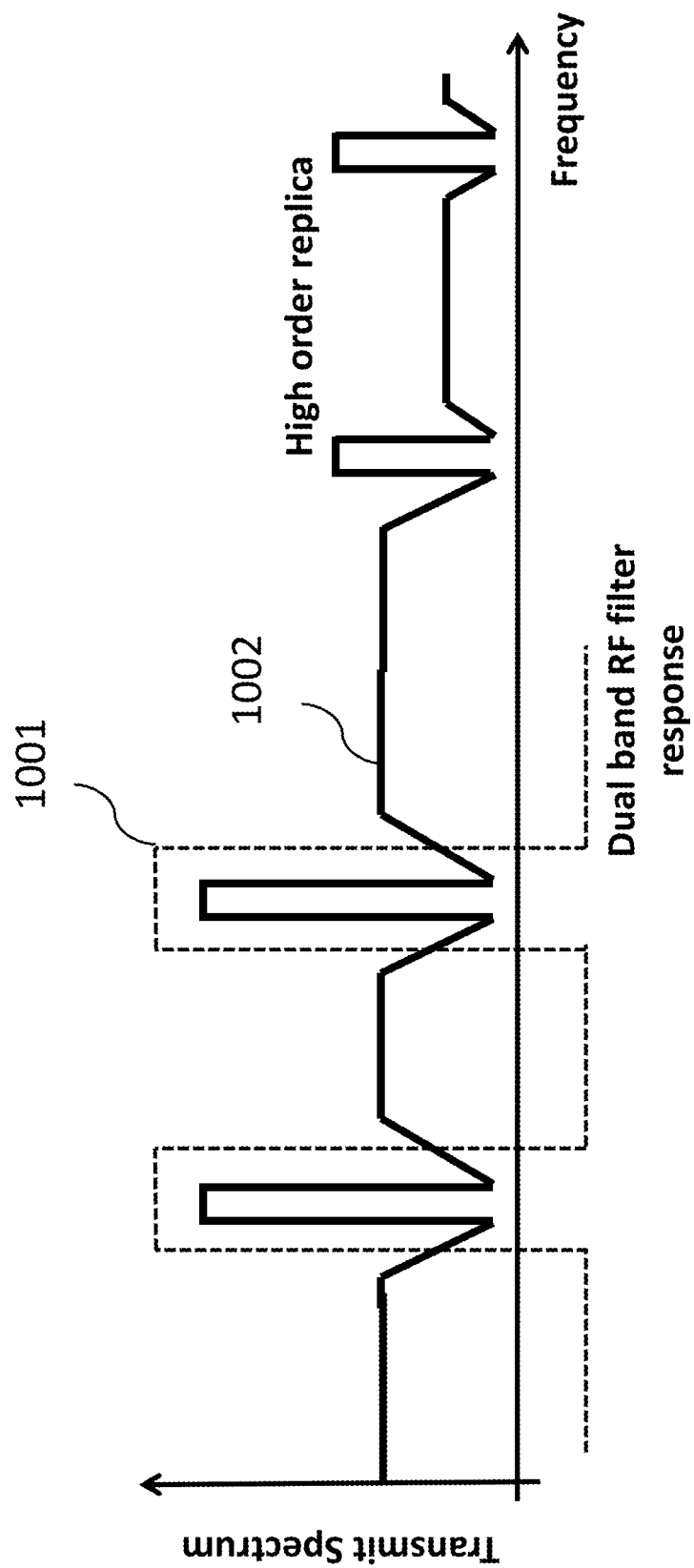
FIG. 10 is an example of an output spectrum of a concurrent non-contiguous multi-band transmitter.

FIG. 10 shows a spectrum 1002 of a concurrent non-contiguous multi-band transmitter 700 at the position of 760 according to some embodiments of the invention. The spectrum 1002 includes two in-band channels and out-of-band noise shared by multi-bit delta-sigma modulation 710. One embodiment uses a dual-band RF filter 1001 to attenuate the out-of-band noise and high-order spectrum replicas, which is the spectrum of 760.

Figure 11:
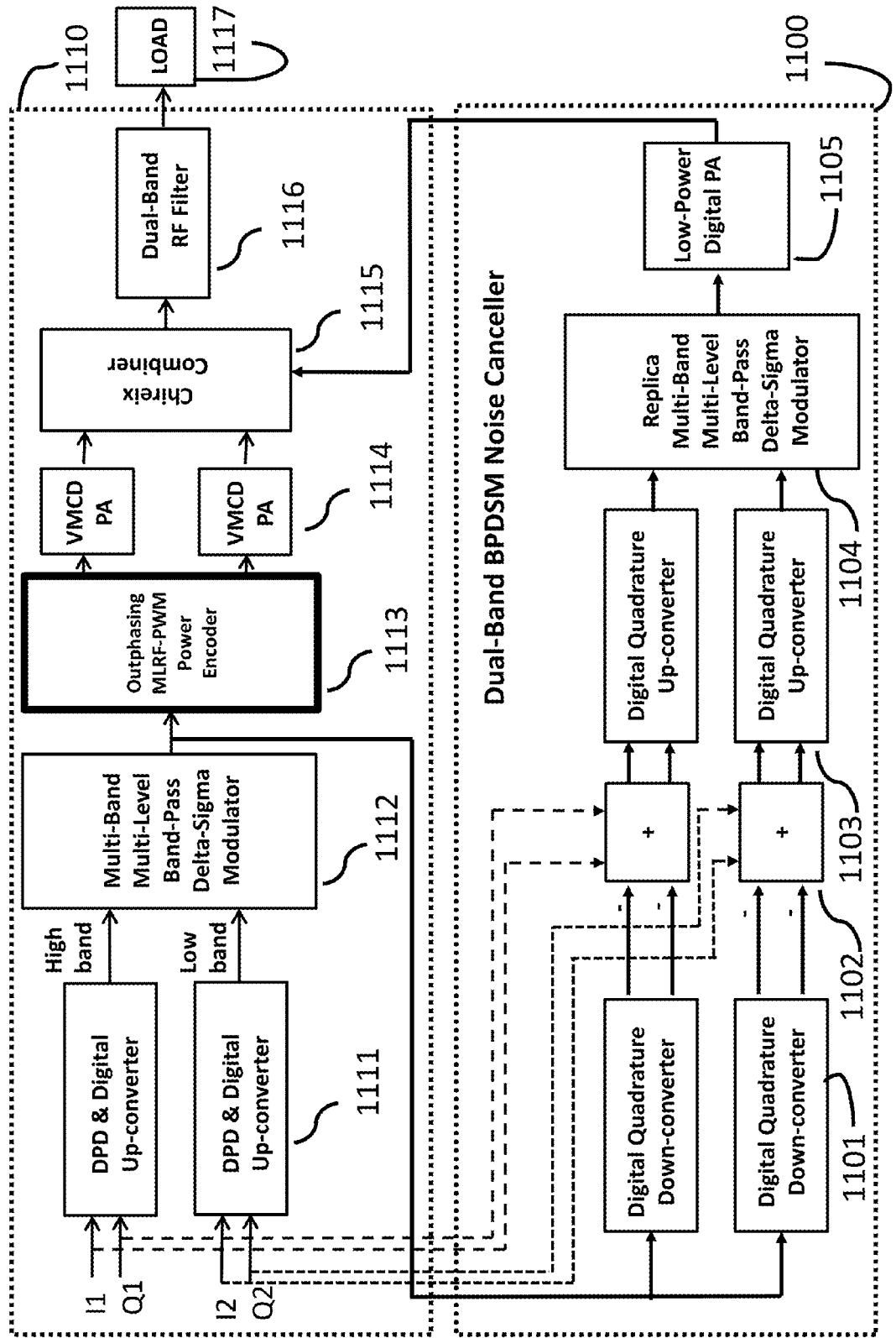
FIG. 11 is a block diagram of an out-of-band noise cancellation system for the non-contiguous multi-band transmitter according to one embodiment of the invention.

FIG. 11 shows a block diagram of an out-of-band noise cancellation system for the non-contiguous multi-band transmitter according to one embodiment of the invention. The dual-band BPDSM noise canceller 1100 cancels the out-ofband emission from the non-contiguous dual-band transmitter 1110. An example of the transmitter 1110 is the non-contiguous multi-band transmitter 700 of FIG. 7. The BPDSM 1112 transforms the RF bands 1111 into a sequence of symbols that is separated into two baseband signals by two digital quadrature down-converters 1101. These baseband signals include both the in-band signals and out-of-band emission from the quantization noise and noise shaping process of the multi-band BPDSM 1112.

The comparison block 1102 extracts the original baseband signal from these two baseband signals, resulting in the out-of-band emission components only. The two digital quadrature up-converters 1103 modulate the out-of-band emission components into the low-band and high-band respectively, which is in turn modulated by the replica multi-band BPDSM 1104. The gain of the digital quadrature up-converters 1103 controls an important trade-off on noise-cancellation. Higher gain allows more cancellation but it requires more power for the low-power digital PA 1105. The low-power digital PA can be implemented by a linear PA (low efficiency) or to use a switch mode PA together with power encoder block 1113 for high efficiency.

Figure 12:
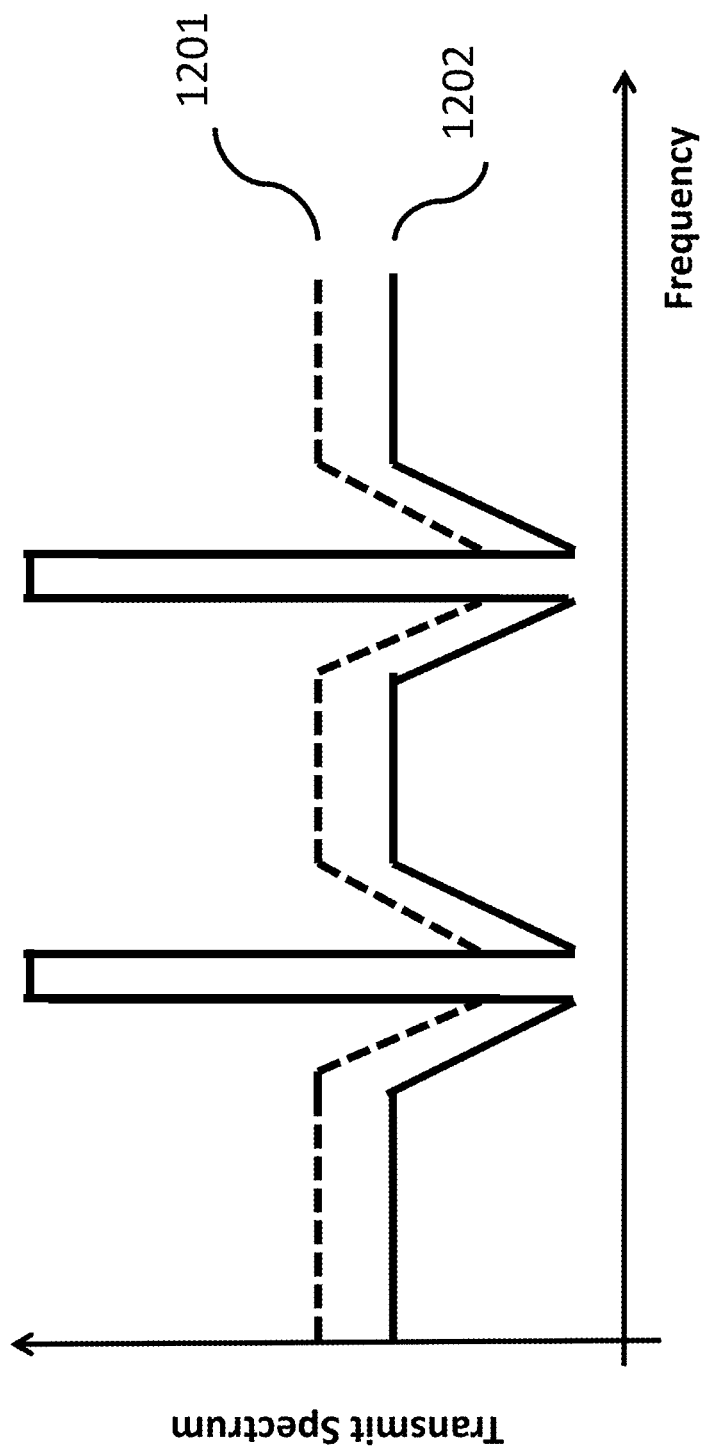
FIG. 12 is an example of reducing the out-of-band noise by the out-of-band noise cancellation system in FIG. 11.

FIG. 12 shows an example of reducing the out-of-band noise by the out-of-band noise cancellation system in FIG. 11. The output spectrum with the noise cancellation 1202 can typically improve more than 10 dB compared to the output spectrum without the noise cancellation 1201. Both the out-of-band and in-band noise improve, which relaxes the multi-band RF output filter design as well as improving in-band SNR.

Although the invention has been described by way of examples of preferred embodiments, it is to be understood that various other adaptations and modifications can be made within the spirit and scope of the invention. Therefore, it is the object of the appended claims to cover all such variations and modifications as come within the true spirit and scope of the invention.

We claim:

1. A method for generating a multi-band signal, comprising:
   transforming multiple base-band envelope signals into a sequence of symbols representing a signal including a plurality of disjoint frequency bands, wherein each frequency band corresponds to a single base-band envelope signal, and wherein each symbol corresponds to an amplitude of the signal and is a number selected from a finite set of numbers;
   encoding the sequence of symbols as a plurality of pulse width modulation (PWM) signals, wherein each PWM signal includes a plurality of codes for encoding each symbol, wherein a sum of values of the codes of the set of PWM signals encoding a symbol is proportional to a value of the symbol;
   amplifying the PWM signals to produce a plurality of amplified signals; and
   combining the plurality of amplified signals to produce the multi-band signal.

2. The method of claim 1, wherein the encoding comprises:
   determining the values of the codes of the PWM signals, such that each value of the code encoding the symbol does not have a sign opposite to a sign of the sum of the values of the codes encoding the symbol.

3. The method of claim 2, wherein the symbol having a negative value is encoded with negative or zero values for all codes encoding the symbol, wherein the symbol having a positive value is encoded with positive or zero values for all codes encoding the symbol, and wherein the symbol having a zero value is encoded with zero values for all codes encoding the symbol.

4. The method of claim 1, wherein the plurality of PWM signals includes a first PWM signal and a second PWM signal, further comprising:
   determining a first portion of the first PWM signal encoding the symbol; and
   determining a second portion of the second PWM signal encoding the symbol, such that the second portion is rotationally symmetric to the first portion.

5. The method of claim 4, further comprising:
   selecting the first portion from a lookup table stored in a memory using the value of the symbol; and
   rotating the first portion around a center of the portion to produce the second portion.

6. The method of claim 4, further comprising:
   selecting, using the value of the symbol, the first portion and the second portion from a lookup table stored in a memory.

7. The method of claim 1, wherein the multi-band signal is a communication signal of radio frequency (RF), wherein the signal is a RF signal, and wherein the transforming produces the sequence of symbols representing the RF signal.

8. The method of claim 1, wherein the encoding comprises:
   encoding the symbol such that the sum of the values of the codes of the plurality of PWM signals encoding the symbol is proportional to the value of the symbol with a coefficient of proportionality that equals a size of a set formed by the plurality of the PWM signals.

9. A system for generating a multi-band signal, comprising:
   a delta-sigma modulator (DSM) for transforming multiple base-band envelope signals into a sequence of symbols representing a signal including a plurality of disjoint frequency bands, wherein each frequency band corresponds to a single base-band envelope signal, and wherein each symbol corresponds to an amplitude of the signal and has a value selected from a finite set of numbers;
   at least one pulse width modulation (PWM) encoder for encoding the sequence of symbols as a plurality of PWM signals, wherein each PWM signal includes a set of codes for encoding each symbol, wherein a sum of values of the codes of portions of the plurality of PWM signals encoding a symbol is proportional to the value of the symbol;
   a plurality of switch mode power amplifiers for amplifying the PWM signals by switching states of switching devices according to amplitudes of the PWM signals to produce a plurality of amplified signals; and
   a combiner for combining the plurality of amplified signals to produce the multi-band signal.

10. The system of claim 9, wherein the multi-band signal is a communication signal of radio frequency (RF), wherein the signal is a RF signal, and wherein the DSM produces the sequence of symbols representing the RF signal.

11. The system of claim 9, wherein the DSM comprises:
   a single-bit multi-band band-pass delta-sigma modulator (BPDSM) connected to a single bit output bus and multiple multi-bit input buses, wherein the BPDSM combines digitally represented radio frequency (RF) signals into a multi-bit digital signal and converts the multi-bit digital signal into a single bit digital output.

12. The system of claim 9, wherein the PWM encoder comprises:
- a look-up table (LUT) and two shift registers for transforming each symbol into a pair of multi-level PWM (MLPWM) codes.

13. The system of claim 9, wherein the switch mode power amplifier comprises
- 2n switching devices for n non-zero levels of the PWM signal to produce $I_n$ current for each level of the PWM signal, wherein a ratio $a_i = I_{n-1}/(I_{n-1}+I_n)$ is between 0.2 and 0.4 inclusively.

14. The system of claim 9, further comprising:
- a multi-band filter for cancelling an out-of-band emission of the multi-band signal.

* * * * *